United States Patent [19]
Johnson

[11] 3,958,195
[45] May 18, 1976

[54] R.F. TRANSISTOR PACKAGE HAVING AN ISOLATED COMMON LEAD

[75] Inventor: Joseph H. Johnson, Sunnyvale, Calif.

[73] Assignee: Varian Associates, Palo Alto, Calif.

[22] Filed: Mar. 21, 1975

[21] Appl. No.: 560,674

[52] U.S. Cl. .............................. 333/84 M; 357/80; 357/81
[51] Int. Cl.² ..................... H01L 23/12; H01P 1/00
[58] Field of Search ............. 333/84 M; 357/74, 80, 357/81; 174/52 S

[56] References Cited
UNITED STATES PATENTS

| | | | |
|---|---|---|---|
| 3,784,883 | 1/1974 | Duncan et al. | 333/84 M X |
| 3,838,443 | 9/1974 | Laighton | 333/84 M X |
| 3,886,505 | 5/1975 | Jacobson | 333/84 M |

*Primary Examiner*—Paul L. Gensler
*Attorney, Agent, or Firm*—Stanley Z. Cole; D. R. Pressman; Robert K. Stoddard

[57] ABSTRACT

In a radio frequency transistor package, a layer of metallization is deposited on an electrically insulative thermally conductive ceramic substrate member serving as a heat sink. An insular region of the metallization serves as a pad for receiving a transistor die with the collector region of the transistor bonded to the insular region of metallization. The region of the metallization surrounding the pad comprises a ground plane. An apertured ceramic insulative spacer is bonded over the ground plane metallization with the aperture in registration over the transistor. Input, output and a pair of common lead metal strips are bonded to the upper surface of the spacer in generally coplanar configuration. The two common leads extend across the spacer adjacent opposite sides of the aperture in generally tangential relation thereto. The input and output leads are disposed in between the common leads and are interrupted by the central aperture in the spacer. The common leads are electrically interconnected to the ground plane metallization layer via conductive means extending through the aperture in the spacer. The input lead is connected to one of the base or emitter regions of the transistor die via wire bonding leads extending through the aperture in the spacer. The other base or emitter region of the transistor die is connected via parallel wire bonding leads to the surrounding ground plane metallization. The output lead is connected via a set of parallel wire bond leads through the central aperture to the transistor pad.

12 Claims, 4 Drawing Figures

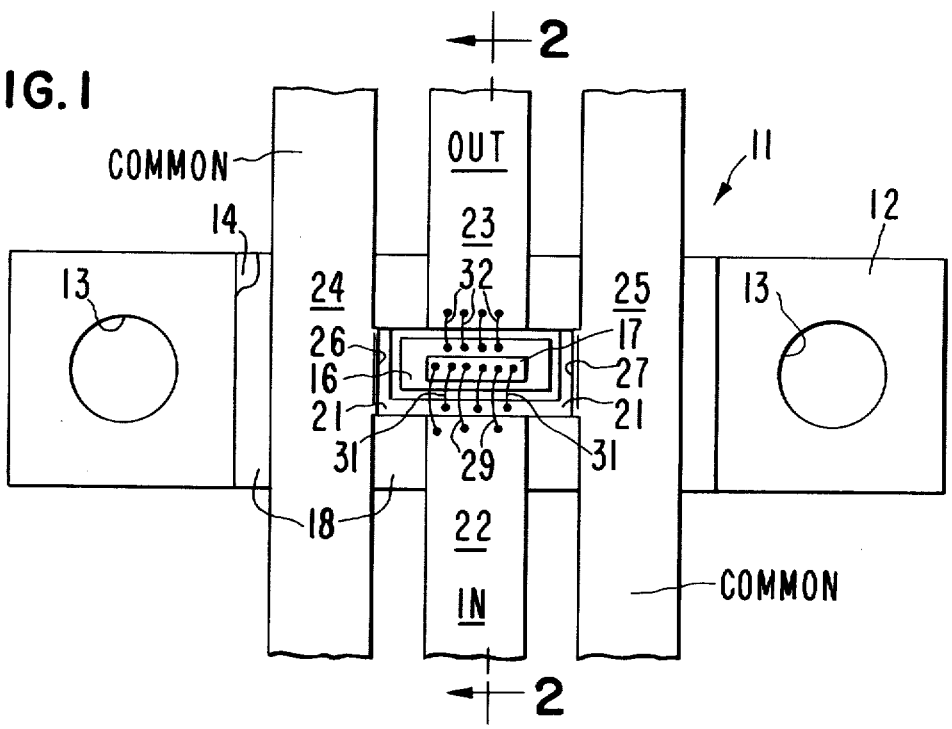
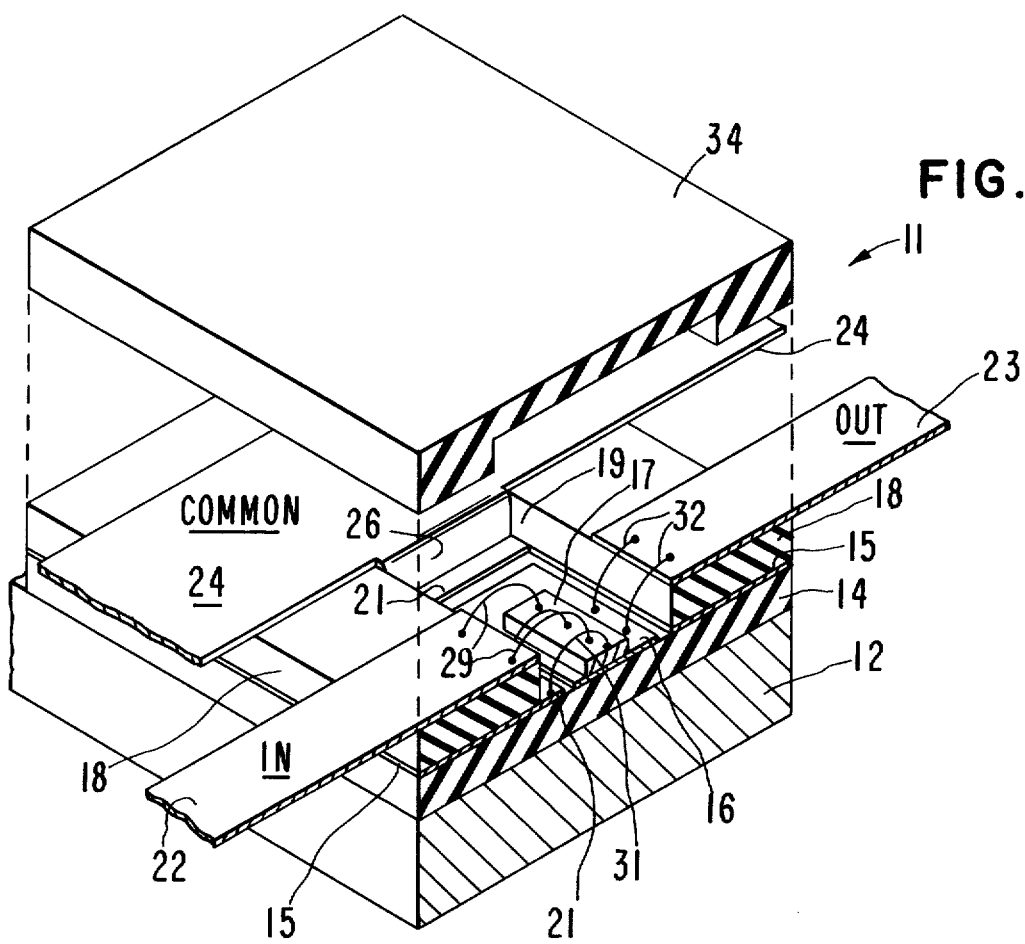

R.F. TRANSISTOR PACKAGE HAVING AN ISOLATED COMMON LEAD

BACKGROUND OF THE INVENTION

The present invention relates in general to radio frequency transistor packages and more particularly to improved radio frequency transistor packages having common leads electrically isolated from the metallic mounting member for mounting the transistor package to a chassis.

DESCRIPTION OF THE PRIOR ART

Heretofore, r.f. transistor packages have been proposed wherein the input r.f. power to a transistor and the output r.f. power from the transistor have been transmitted to and from the transistor via the intermediary of a transmission line system consisting of three coplanar conductive strips. A first one of the strips was interrupted to form the input and output leads and the second and third strips were disposed on opposite sides of the first strip and were connected together as a ground plane or common lead structure. This transmission system allows better control of parasitic inductances and capacitances associated with the transistor package by eliminating the chassis and the metallic mounting and heat sinking structure from the r.f. input and output circuits. Such a coplanar arrangement of input and output leads is disclosed in U.S. Pat. No. 3,713,006 issued Jan. 23, 1973.

It is also known from the prior art of r.f. transistor packages, to form the package by metallizing the upper surface of a beryllia ceramic substrate, such metallization having a central insular region electrically isolated from the rest of the metallization to serve as the collector pad for receiving the transistor die thereon. An apertured electrically insulative spacer plate was disposed with the aperture in registration over the transistor die. The input and output strip leads were bonded onto the upper surface of the spacer and wire bonding leads extended through the aperture from these strips to the input electrode of the transistor and to the transistor pad, respectively. The common electrode of the transistor die was connected via wire bonding leads extending outwardly of the die to the surrounding ground plane metallization. The ground plane metallization on the substrate extended over the lip thereof for making electrical contact to the chassis so that the chassis served as the ground plane or common conductor of the transistor package. Such a transistor package is disclosed in U.S. Pat. No. 3,651,434 issued Mar. 21, 1972.

SUMMARY OF THE PRESENT INVENTION

The principal object of the present invention is the provision of an improved r.f. transistor package having a common lead structure electrically isolated from the transistor mounting structure and chassis.

In one feature of the present invention, the transistor package includes a generally planar ground plane metallization surrounding a transistor mounting pad supporting the transistor die. An electrically insulative apertured spacer plate is disposed over the ground plane structure with the aperture of the spacer in registration over the transistor. The input and output lead structures are disposed overlaying the apertured spacer, such input and output lead structures extending across the spacer and intersecting with the aperture. A common lead structure extends across the spacer adjacent the aperture and the input and output leads. Interconnect leads interconnect the leads overlaying the spacer with the underlying ground plane and transistor electrodes through the aperture in the spacer.

In another feature of the present invention, the input and output and common lead structures overlaying the spacer are coplanar with the input and output leads disposed between a pair of the common or ground plane leads.

Other features and advantages of the present invention will become apparent upon a perusal of the following specification taken in connection with the accompanying drawings wherein:

BRIEF DESCRIPTION OF THE DRAWINGS

FIG. 1 is a plan view of a radio frequency transistor structure incorporating features of the present invention, such view being taken with the cap of the transistor package removed, FIG. 2 is an enlarged sectional view of the structure of FIG. 1 taken along line 2—2 in the direction of the arrows.

DESCRIPTION OF THE PREFERRED EMBODIMENTS

Figure 3:
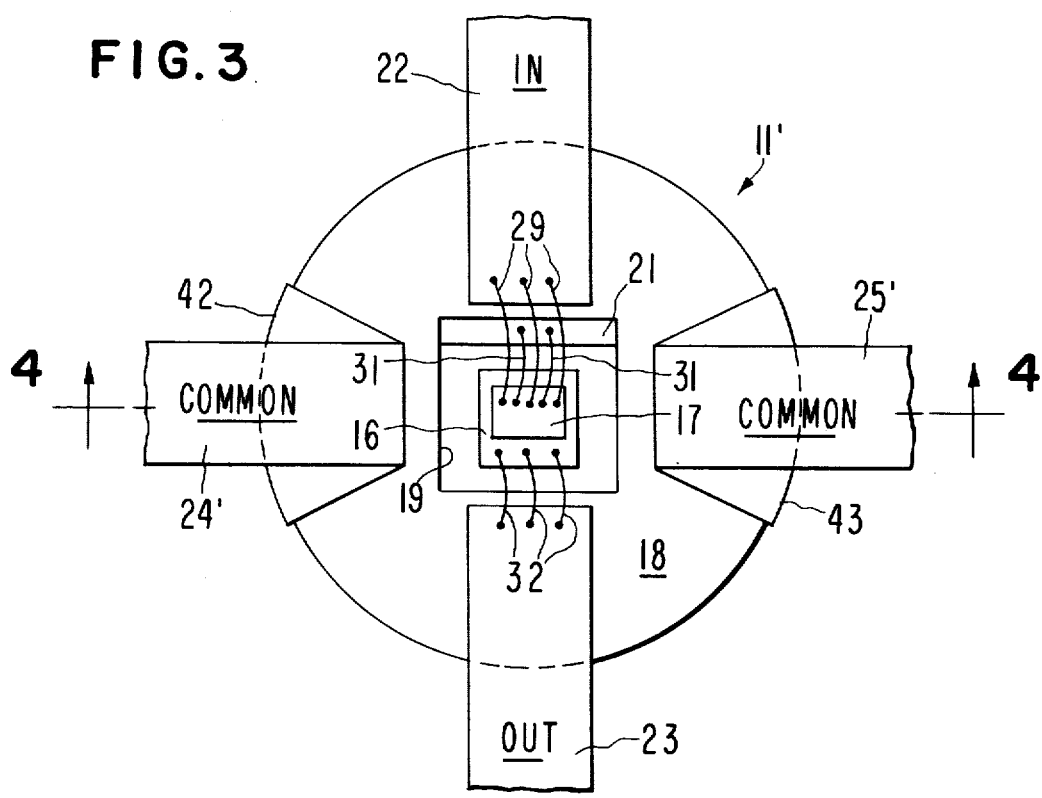
FIG. 3 is a plan view similar to that of FIG. 1 of an alternative embodiment of the present invention.

Referring now to FIGS. 1 and 2 there is shown a radio frequency transistor package 11 incorporating features of the present invention. The transistor package includes a generally rectangular metallic mounting plate 12, as of copper, having a pair of mounting holes 13 disposed in opposite ends thereof for bolting the mounting plate 12 to a chassis. Mounting plate 12 serves as a heat sink for the transistor. Good thermal contact between the mounting plate 12 and the chassis further facilitates the removal of heat from the transistor package.

A thermally conductive electrically insulative substrate member 14, as of beryllia ceramic, is bonded to the upper surface of the mounting plate 12 via conventional metal-to-ceramic bonding techniques. The upper surface of the substrate member 14 is metallized to form a ground plane layer 15. An insular region of metallization 16 on the upper surface of the insulative member 14 serves as the transistor die mounting pad to receive the transistor die 17. Transistor die 17 includes base, emitter and collector semiconductive regions with conventional metallized electrode pads electrically conductively connected to the respective semiconductive regions. The collector electrode is located on the lower surface of the die 17 and is bonded in electrical contact to the transistor mounting pad 16 for making electrical connection to the collector region of the die 17.

An electrically insulative ceramic spacer plate 18, as of beryllia ceramic, is disposed overlaying the ground plane metallization layer 15 and is bonded thereto via a conventional metal-to-ceramic bond. The spacer plate 18 includes a central rectangular aperture 19 disposed in registration over the transistor 17. The central aperture 19 has dimensions sufficiently large so as to expose an inner lip portion 21 of the ground plane metallization 15 surrounding the mounting pad 16 on three sides. However, on the fourth side or output side the lip of the aperture 19 is in substantial vertical registration with the inner lip of the metallized layer 15 so that the layer 15 is not exposed along the output side of the aperture 19.

An input and output r.f. transmission line system is provided on the upper surface of the spacer 18. More particularly, the input transmission line system consists of an input strip lead 22 bonded to the upper surface of the spacer 18 and extending across the upper surface thereof to and intersecting with the central aperture 19. Similarly, an output strip lead 23 is bonded to the upper surface of the spacer 18 on the opposite side of the aperture 19 from the input lead, such output lead being generally coaxial with the input lead 22 and extending to and intersecting with the central aperture 19. A pair of common strip leads 24 and 25 extend across the upper surface of the spacer 18 on opposite sides of the input and output leads 22 and 23. The common leads 24 and 25 are electrically connected to the annular ground plane region 15 via the intermediary of strips of metallization 26 and 27. Strips 26 and 27 extend from the common leads 24 and 25, respectively, over the lip and down across the side wall of the central aperture 19 to and interconnect to the exposed lip portion 21 of the annular ground plane region 15.

The input strip lead 22 is connected to either the base or emitter region of the transistor die (depending upon whether common emitter or common base operation is desired) via a plurality of parallel wire bond leads 29. The other emitter or base electrode of the transistor die 17 is connected to the adjacent exposed lip portion 21 of the ground plane layer 15 via a plurality of parallel wire bond leads 31. The common wire bond leads 31 are interdigitated with the input wire bond leads 29 so that the input and common leads 29 and 31 lie in interdigitated generally parallel planes. The output lead 23 is interconnected to the collector region of the transistor die 17 by parallel wire bond leads 32 interconnecting between the mounting pad 16 and the output strip lead 23. A generally rectangular ceramic cap 34 is sealed over the upper surface of the spacer 18 and strip leads.

Figure 4:
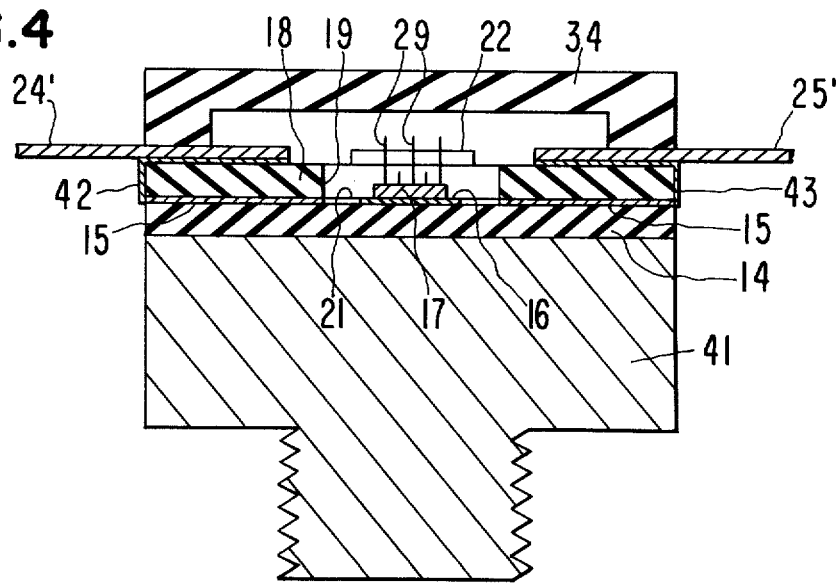
FIG. 4 is a transverse view of the structure of FIG. 3 taken along line 4—4 in the direction of the arrows.

Referring now to FIGS. 3 and 4, there is shown an alternative embodiment of the present invention. More particularly, the transistor package is of the type for stud mounting to the chassis. The transistor 11' is substantially the same as that of FIGS. 1 and 2 with the exception that the heat sinking plate 12 is replaced by a heat sinking stud 41, as of copper. In addition, the spacer plate 18 is of circular configuration and the common leads 24' and 25' extend radially outward from the central aperture 19 instead of running parallel to the input and output strips 22 and 23. Furthermore the interconnection from the common leads 24 and 25 to the underlying ground plane layer 15 is made via the intermediary of metallization strips 42 and 43 extending between the respective common leads 24' and 25' over and down the outside wall of the spacer 18.

In an alternative embodiment, the common interconnect strips of metallization 26 and 27 for interconnecting the common leads 24 and 25, respectively, with the exposed lip 21 of the ground plane region 15 are replaced by a plurality of parallel wire bond leads similar to the output leads 32.

The advantage of the radio frequency transistor package 11 incorporating features of the present invention is that unwanted parasitic inductances, associated with prior transistor packages wherein the metallic heat sinking and mounting portions of the transistor package served as the ground plane for the package, have been reduced and better controlled and the package is relatively simple of manufacture, thereby reducing the costs of the package.

What is claimed is:

1. In a radio frequency transistor package having an electrically isolated common lead structure:
    an electrically insulative thermally conductive substrate structure;
    an electrically conductive transistor mounting pad disposed overlaying said substrate structure in thermal energy exchanging relation therewith;
    a first layer of electrically conductive material disposed overlaying said substrate structure, said first layer of conductive material being disposed around said mounting pad in electrically insulative relation thereto to form a ground plane region;
    an electrically insulative spacer structure disposed overlaying said first layer of electrically conductive material, said insulative spacer structure having an aperture therein disposed in registration over said mounting pad, said aperture having sufficient cross-sectional dimensions to expose said mounting pad and at least a portion of an inside marginal lip of said ground plane region of said first layer of electrically conductive material; and
    a second layer of electrically conductive material overlaying said spacer structure, said second layer of electrically conductive material having at least a gap therein separating said second layer into at least first and second strip portions, said first strip portion defining a common lead portion extending over said spacer structure adjacent said aperture, said second strip portion extending over said spacer structure and intersecting with and being interrupted by said aperture to electrically insulatively separate said second strip portion into an input lead portion and an output lead portion, said input lead portion, said output lead portion and said first strip portion being mutually insulated from one another to form electrically discrete portions of said second layer.

2. The apparatus of claim 1 wherein said common lead, input lead and output lead portions of said second electrically conductive layer are all coplanar.

3. The apparatus of claim 1 including metallic mounting means disposed underlaying said insulative substrate in heat exchanging relation therewith for affixing the transistor package to an electrical chassis.

4. The apparatus of claim 1 including electrically conductive interconnect means extending through said aperture and electrically interconnecting said inside marginal lip portion of said ground plane region of said first electrically conductive layer with said common lead portion of said second electrically conductive layer.

5. The apparatus of claim 4 wherein said electrically conductive interconnect means comprises a layer of electrically conductive material disposed on the inside side wall of said aperture in said electrically insulative spacer structure.

6. The apparatus of claim 4 including, transistor die means having base, emitter and collector semiconductive regions formed therein disposed on said transistor mounting pad, said collector region of said transistor die means being electrically connected to said mounting pad, second electrically conductive interconnect means extending through said aperture in said spacer and electrically interconnecting said input lead portion of said second electrically conductive layer and one of said base and emitter regions of said transistor die means, and third electrically conductive interconnect means extending through said aperture in said spacer and electrically interconnecting said output lead portion of said second electrically conductive layer and said mounting pad.

7. The apparatus of claim 1 wherein said common lead portion of said second electrically conductive layer includes first and second portions extending over said spacer structure adjacent said aperture, said first and second common lead portions being disposed on opposite sides of said input and output lead portions of said second electrically conductive layer.

8. The apparatus of claim 7 wherein said first and second common lead portions, said input lead portion, and said output lead portion of said second electrically conductive layer are all coplanar.

9. The apparatus of claim 8 including electrically conductive interconnect means extending through said aperture and electrically interconnecting said inside marginal lip portion of said first electrically conductive layer and both of said common lead portions of said second electrically conductive layer.

10. The apparatus of claim 9 wherein said electrically conductive interconnect means comprises a layer of electrically conductive material disposed on the inside wall of said aperture in said electrically insulative spacer structure.

11. The apparatus of claim 1 including electrically conductive interconnect means extending across the outside side wall of said insulative spacer structure and electrically interconnecting said ground plane region of said first electrically conductive layer with said common lead portion of said second electrically conductive layer.

12. The apparatus of claim 11 wherein said common lead portions of said second electrically conductive layer includes, first and second portions disposed on said spacer structure on opposite sides of said aperture.

* * * * *